| [19] | [11] Patent Number: | 5,143,948 |
|---|---|---|

United States Patent

Okinoshima et al.

[45] Date of Patent: * Sep. 1, 1992

[54] SEMICONDUCTOR ELEMENT PROTECTING COMPOSITIONS

[75] Inventors: Hiroshige Okinoshima, Annaka; Hideto Kato, Takasaki, both of Japan

[73] Assignee: Shin-Etsu Chemical Co., Ltd., Tokyo, Japan

[*] Notice: The portion of the term of this patent subsequent to Aug. 20, 2008 has been disclaimed.

[21] Appl. No.: 561,865

[22] Filed: Aug. 2, 1990

[30] Foreign Application Priority Data

Aug. 2, 1989 [JP] Japan .................................. 1-201005

[51] Int. Cl.$^5$ .............................................. C08K 9/06
[52] U.S. Cl. ..................................... 523/212; 523/213; 524/356; 524/366; 524/493; 524/588; 528/25; 528/38; 528/40
[58] Field of Search ............... 523/212, 213, 361, 366, 523/600

[56] References Cited

U.S. PATENT DOCUMENTS

| 4,433,131 | 2/1984 | Bolon et al. | 524/600 |
|---|---|---|---|
| 4,612,361 | 9/1986 | Peters | 524/600 |
| 4,853,452 | 8/1989 | Lee | 524/600 |
| 4,864,016 | 9/1989 | DuPont et al. | 528/353 |
| 4,997,869 | 3/1991 | Eisenbraun et al. | 524/600 |
| 5,041,513 | 8/1991 | Okinoshima et al. | 528/10 |

FOREIGN PATENT DOCUMENTS

| 4726878 | 7/1947 | Japan . |
|---|---|---|
| 52-18426 | 2/1977 | Japan . |
| 52-30319 | 8/1977 | Japan . |
| 55-65227 | 5/1980 | Japan . |
| 57-41330 | 9/1982 | Japan . |
| 58-187430 | 11/1983 | Japan . |
| 60-35026 | 2/1984 | Japan . |
| 59-56452 | 3/1984 | Japan . |
| 59-56453 | 3/1984 | Japan . |
| 59-56454 | 3/1984 | Japan . |
| 60-197731 | 10/1985 | Japan . |
| 61-83228 | 4/1986 | Japan . |

*Primary Examiner*—Paul R. Michl
*Assistant Examiner*—Edward Cain
*Attorney, Agent, or Firm*—Birch, Stewart, Kolasch & Birch

[57] ABSTRACT

A polyimide resin is prepared by polymerizing (A) a tetracarboxylic acid dianhydride component consisting essentially of 10 to 50 mol % of 2,2-bis(3,4-benzenedicarboxylic anhydride)perfluoropropane and 90 to 50 mol % of pyromellitic dianhydride or similar acid dianhydride and (B) a diamine component consisting essentially of 10 to 80 mol % of a silicon diamine and 90 to 20 mol % of an ether diamine. The polyimide resin is dissolved in an organic solvent and blended with finely divided silica to form a composition which is useful for protecting semiconductor elements.

15 Claims, No Drawings

SEMICONDUCTOR ELEMENT PROTECTING COMPOSITIONS

CROSS-REFERENCE TO RELATED APPLICATION

This application is related to our copending application Ser. No. 07/531,097 filed May 31, 1990, for "Polyimide Resin Compositions" which is incorporated herein by reference.

This invention relates to polyimide resin compositions suitable for protecting semiconductor elements.

BACKGROUND OF THE INVENTION

In general, semiconductor elements including transistors, diodes, integrated circuits, and large scale integrated circuits are encapsulated with resinous materials, typically epoxy resins. However, semiconductor elements encapsulated with conventional resinous materials often suffer from deterioration by water and ionic contaminants which can penetrate through the resin encapsulants. One effective solution is to provide semiconductor elements with protective coatings of polyimide resins having excellent heat resistance, electrical properties, and mechanical properties before sealing with resinous encapsulants.

However, although polyimide resins are generally heat resistant, they are insoluble in solvents except some high-boiling organic solvents. It is thus a common practice to form a polyimide resin coating by dissolving a polyamic acid which is a polyimide precursor in an organic solvent to form a coating solution, applying the solution to a semiconductor element, and heating the coating for curing (imidization). This method requires heat treatment at 300° C. or higher temperatures for extended periods of time for converting polyamic acid into polyimide before polyimide resin coatings are formed. The high-temperature, long-term heating step is a disadvantageous working step, especially from the standpoint of energy consumption. If heating is insufficient, then some polyamic acid would be left in the resulting resin structure, resulting in the polyimide resin being less resistant against humidity and corrosion. Particularly for insulating protective coatings on semiconductor elements, such losses of resin attributes would undesirably deteriorate semiconductor elements to reduce their service life.

Several methods are known in the art for the preparation of polyimide resins soluble in organic solvents. One method is by heating tetracarboxylic acid dianhydrides and aromatic diamines in such solvents as phenol and halophenols for reaction to thereby form polyimide resins soluble in phenolic solvents (e.g., Japanese Patent Publication Nos. 26878/1972, and Jap. Pat. Appln. Kokai 65227/1980, 187430/1983, 35026/1985, and 197731/1985). Another method is by reacting specific tetracarboxylic acid dianhydrides and specific diamines to form polyimides soluble in polar solvents having a high boiling point such as N-methyl-2-pyrrolidone (e.g., Japanese Patent Publication No. 30319/1977, and Jap. Appln. Kokai 83228/1986, and 18426/1987).

The polyimide resins prepared by the former method require careful handling and are less safe or hygienic in that when they are used as solutions in phenolic solvents to form coatings, evaporation of the solvent gives off a foul smell like cresol odor and the solvent causes chemical scald to the skin on accidental contact therewith. In turn, the polyimide resins prepared by the latter method have the problem that when they are applied to substrates as solutions in N-methyl-2-pyrrolidone which is highly hygroscopic, the coatings become white turbid due to moisture absorption, resulting in a loss of film strength. In addition, no improvement in working conditions is expected because N-methyl-2-pyrrolidone solvent has a high boiling point so that high-temperature, long-term heating is necessary to completely remove the solvent. Thus, these resins are against the purpose of forming polyimide films of quality by low-temperature, short-term heating.

Furthermore, in applying polyimide resin solutions to semiconductor elements by these techniques, the semiconductor elements at the surface tend to repel the applied solutions, often failing to coat necessary sites or to form an even coating due to varying coverage. Particularly when steps and ramps are present in semiconductor elements, the resin coatings deposited at such sites are too thin to provide semiconductor protection and often contain pinholes and other defects. All these factors lead to a loss of reliability of semiconductor elements.

For reducing variations in coating thickness, Japanese Patent Application Kokai 56452/1984, 56453/1984, and 56454/1984 disclose semiconductor element protecting compositions in which various fillers are blended in polyimides soluble in organic solvents. These compositions also suffer from the solvent related problems because phenol, N-methyl-2-pyrrolidone and similar solvents are used.

Therefore, an object of the present invention is to provide a novel and improved semiconductor element protecting composition comprising a polyimide resin which is dissolvable in a low-boiling, volatile organic solvent to form a solution which is ready to form a polyimide resin film having improved adherence, heat resistance, electrical and mechanical properties through a low-temperature, short-term heating step. Another object of the invention is to provide such a protecting composition which is shelf stable and safe. A further object of the invention is to provide such a protecting composition to which semiconductor elements on the surface show improved receptivity so that uniform defect-free films may form even around steps and ramps on the elements.

SUMMARY OF THE INVENTION

Attempting to impact solubility in low-boiling organic solvents to polyimide resins, the inventors have found that polyimide resins which are prepared by polymerizing (A) a tetracarboxylic acid dianhydride component consisting essentially of 10 to 50 mol % of the acid dianhydride of the structural formula:

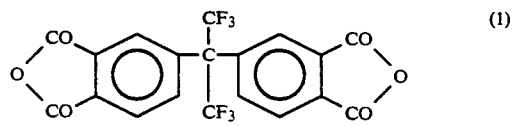

and 90 to 50 mol % of an acid dianhydride of the structural formula:

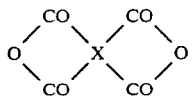

wherein X is a tetravalent organic group selected from the class consisting of

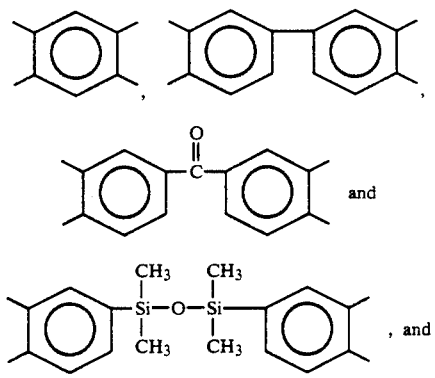

(B) a diamine component consisting essentially of 10 to 80 mol % of a silicon diamine of the structural formula:

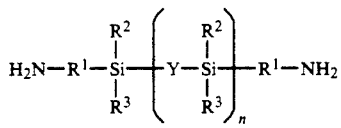

wherein $R^1$ is a divalent organic group having 1 to 18 carbon atoms, $R^2$ and $R^3$ are independently selected from monovalent substituted or unsubstituted hydrocarbon groups having 1 to 10 carbon atoms, Y is an oxygen atom or a divalent hydrocarbon group having 1 to 10 carbon atoms, and letter n is an integer of from 1 to 100, and 90 to 20 mol % of an ether diamine of the formula:

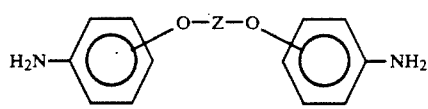

wherein Z is a divalent organic group having 6 to 18 carbon atoms containing an aromatic ring, with the proviso that diamine component (B) consists essentially of 5 to 100 mol % of the silicon diamine and 95 to 0 mol % of the ether diamine when Y in formula (3) is an oxygen atom, according to a well-known method are well soluble in low-boiling organic solvents including ether and ketone solvents as opposed to the conventional polyimide resins which are soluble only in limited solvents such as phenolic solvents and N-methyl-2-pyrrolidone. A polyimide resin coating can be formed from a solution of the polyimide resin in a low-boiling organic solvent through a low-temperature, short-term heating step, achieving a substantial improvement in working conditions, energy saving, and cost reduction as well as a safety and hygiene aspect. The resulting polyimide resin coating has improved adherence, heat resistance, electrical and mechanical properties. Since the polyimide resin is free of a functional group capable of gelation, it is well stable in a solvent for a long period of shelf storage without degradation.

We have found that a composition obtained by blending finely divided silica, especially finely divided silica having a surface modified with an organic silyl group in the above-defined polyimide resin solution minimizes repellency of semiconductor elements on the surface so that uniform defect-free films form even where the elements are stepped or graded. Thus, semiconductor elements protected by coatings obtained by applying a composition of the polyimide resin solution and finely divided silica and causing the solvent to vaporize are highly reliable.

Therefore, the present invention provides a semiconductor element protecting composition comprising a polyimide resin, an ether, ketone or similar solvent therefor, and finely divided silica, wherein the polyimide resin is prepared by polymerizing (A) a tetracarboxylic acid dianhydride component consisting essentially of 10 to 50 mol % of the acid dianhydride of formula (1) and 90 to 50 mol % of an acid dianhydride of formula (2) and (B) a diamine component consisting essentially of 10 to 80 mol % of a silicon diamine of formula (3) and 90 to 20 mol % of an ether diamine of formula (4), with the proviso that diamine component (B) consists essentially of 5 to 100 mol % of silicon diamine of formula (3) and 95 to 0 mol % of ether diamine of formula (4) when Y in formula (3) is an oxygen atom.

DETAILED DESCRIPTION OF THE INVENTION

As described above, the polyimide resin according to the present invention is prepared by polymerizing (A) a tetracarboxylic acid dianhydride component and (B) a diamine component. Component (A) consists essentially of 2,2-bis(3,4-benzenedicarboxylic anhydride)perfluoropropane of formula (1):

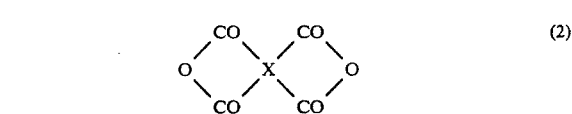

and an acid dianhydride of formula (2):

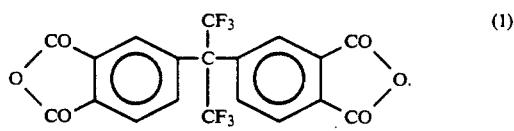

The acid dianhydride of formula (2) is selected from pyromellitic dianhydride where X is

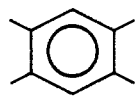

benzophenonetetracarboxylic dianhydride where X is 3,3',4,4'-biphenyltetracarboxylic dianhydride where X is

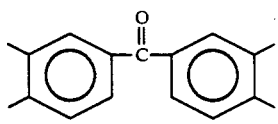

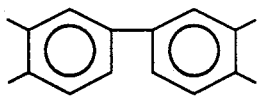

and 1,3-bis(3,4-dicarboxyphenyl)-1,1,3,3-tetramethyl-disiloxane dianhydride where X is

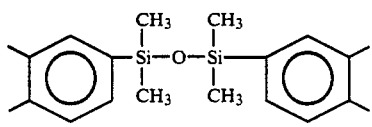

A mixture of such acid dianhydrides is also contemplated.

The benefits of the invention are obtained when the tetracarboxylic dianhydride component (A) consists essentially of 10 to 50 mol %, preferably 20 to 50 mol % of the acid dianhydride of formula (1) and 90 to 50 mol %, preferably 80 to 50 mol % of the acid dianhydride of formula (2).

The diamine component (B) used herein consists essentially of a silicon diamine of the structural formula:

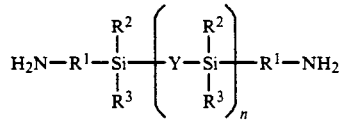 (3)

and an ether diamine of the structural formula:

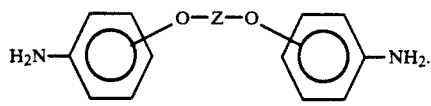 (4)

In formula (3), letter n is an integer of from 1 to 100, preferably 1 to 60, and $R^1$ is selected from divalent organic groups having 1 to 18 carbon atoms, preferably 1 to 7 carbon atoms, for example,

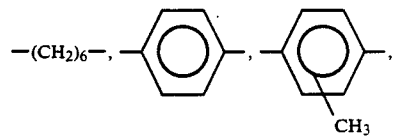

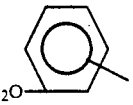

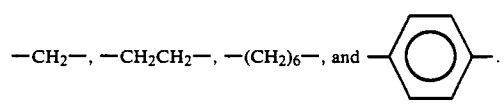

$R^2$ and $R^3$, which may be the same or different, are independently selected from monovalent substituted or unsubstituted hydrocarbon groups having 1 to 18 carbon atoms, preferably 1 to 7 carbon atoms, for example, alkyl groups such as methyl, ethyl, propyl, and butyl groups; cycloalkyl groups such as a cyclohexyl group; alkenyl groups such as vinyl, allyl, propenyl and butenyl groups; aryl groups such as phenyl and tolyl groups; and substituted ones of these groups in which some or all the hydrogen atoms are replaced by halogen atoms or the like, such as chloromethyl, 2-cyanoethyl and 3,3,3-trifluoropropyl groups.

In formula (3), Y is selected from an oxygen atom and divalent hydrocarbon groups having up to 10 carbon atoms, preferably having 1 to 6 carbon atoms, for example,

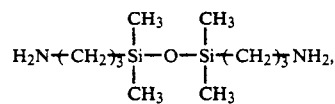

Illustrative, non-limiting examples of the diamine of formula (3) wherein Y is an oxygen atom include the following diaminosiloxanes.

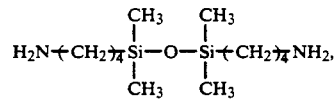

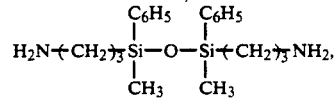

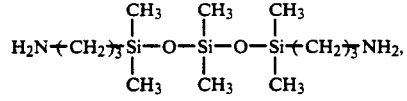

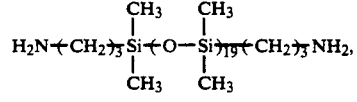

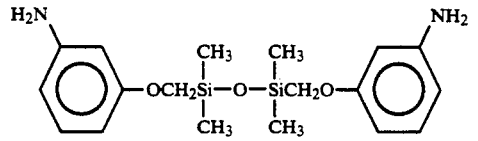

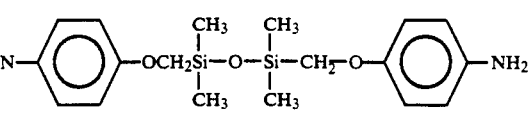

Illustrative, non-limiting examples of the diamine of formula (3) wherein Y is a divalent hydrocarbon group include the following silicon diamines.

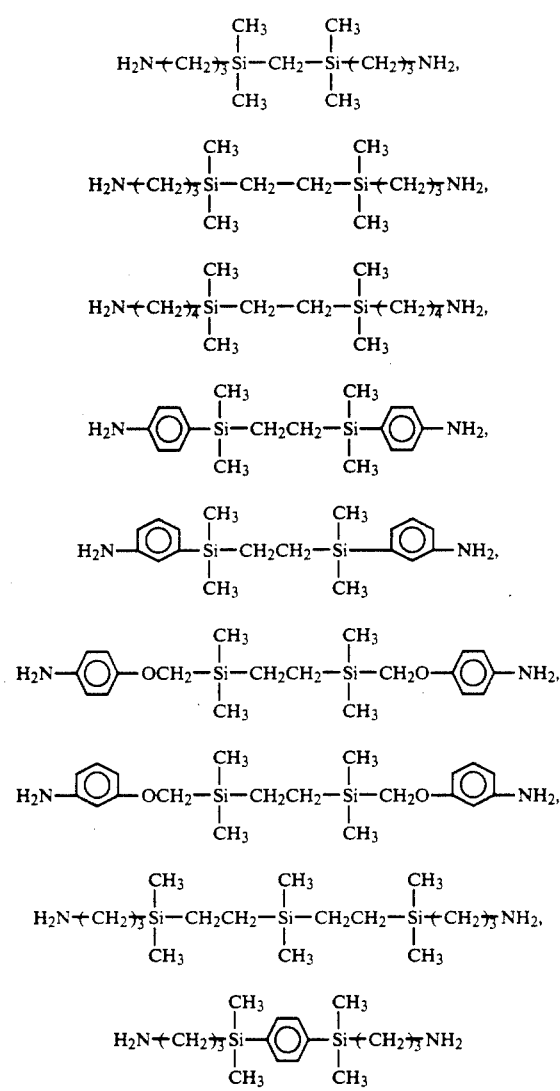

The other ingredient of diamine component (B) is an ether diamine of formula (4) wherein Z in a divalent organic group with 6 to 18 carbon atoms containing an aromatic ring. Illustrative, non-limiting examples of the ether diamines include 1,4-bis(4-aminophenoxy)benzene, 1,3-bis(4-aminophenoxy)benzene, and 1,3-bis(3-aminophenoxy)benzene where Z is

4,4'-bis(4-aminophenoxy)diphenyl where Z is

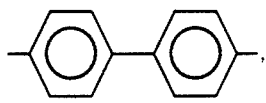

2,2-bis[4-(4-aminophenoxy)phenyl]propane where Z is

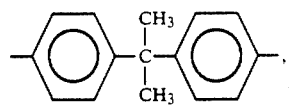

2,2-bis[4-(4-aminophenoxy)phenyl]perfluoropropane where Z is

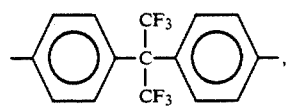

2,2-bis[4-(4-aminophenoxy)phenyl]sulfone where Z is

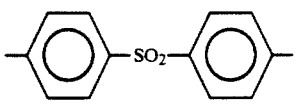

The benefits of the invention are obtained when diamine component (B) consists essentially of 10 to 80 mol %, preferably 20 to 60 mol % of the silicon diamine of formula (3) and 90 to 20 mol %, preferably 80 to 40 mol % of the ether diamine of formula (4) when Y in formula (3) is a divalent hydrocarbon group. It consists essentially of 5 to 100 mol %, preferably 20 to 80 mol % of the silicon diamine of formula (3) and 95 to 0 mol %, preferably 80 to 20 mol % of the ether diamine of formula (4) when Y in formula (3) is an oxygen atom.

Tetracarboxylic dianhydride component (A) and diamine component (B) are preferably blended in a molar ratio of from 0.9 to 1.1, more preferably from 0.95 to 1.05.

Using the above-defined tetracarboxylic dianhydride component (A) and diamine component (B) in the above-defined proportion, a polyimide resin may be prepared by any conventional well-known polymerization method. For example, predetermined amounts of tetracarboxylic dianhydride component (A) and diamine component (B) are dissolved in a polar organic solvent such as N-methyl-2-pyrrolidone, N,N'-dimethylformamide, and N,N'-dimethylacetamide and reacted at low temperatures to synthesize a polyamic acid resin which is a polyimide resin precursor. Without isolation, the reaction solution of the polyamic acid resin is heated to a temperature of 100° to 200° C., preferably 140° to 180° C. whereby dehydration ring-closing reaction takes place on the acid amide moiety of the polyamic acid resin, synthesizing the desired polyimide resin. Since water is formed as a by-product at this stage, an azeotropic dewatering solvent such as toluene and xylene is preferably used in order to complete the dehydration ring-closing reaction within a short time. The progress of this polymerization reaction can be monitored by a well-known method for detecting a change in the absorption band of an imide group in an infrared absorption spectrum (see Japanese Patent Publication No. 41330/1982). After imidization by dehydration ring-closing reaction is completed, the polyimide resin may be collected, for example, by cooling down the reaction solution and pouring the solution into methanol, thereby precipitating the resin again, followed by drying.

The thus obtained polyimide resin consists essentially of 10 to 50 mol % of recurring units of formula (a) and 90 to 50 mol % of recurring units of formula (b).

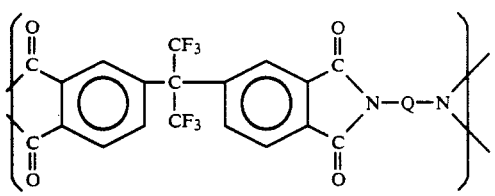

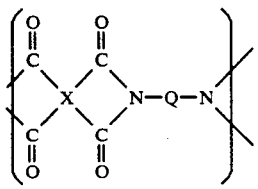

In formulae (a) and (b), X is as defined above, and Q consists essentially of 10 to 80 mol % of units of formula (c):

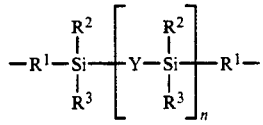

wherein $R^1$, $R^2$, $R^3$, Y, and n are as defined above, and 90 to 20 mol % of units of formula (d):

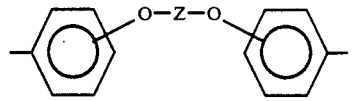

wherein Z is as defined above, with the proviso that Q consists essentially of 5 to 100 mol % of units of formula (c) and 95 to 0 mol % of units of formula (d) when Y in formula (c) is an oxygen atom.

The resulting polyimide resin is well soluble in low-boiling organic solvents having a boiling point of up to 180° C., especially 60° to 180° C. under atmospheric pressure (760 mmHg), for example, ethers such as tetrahydrofuran, 1,4-dioxane, and diglyme, and ketones such as cyclohexanone. If desired, the polyimide resin may be dissolved in a mixture of such solvents.

The semiconductor element protecting composition of the invention is obtained by blending finely divided silica in a solution of the above-defined polyimide resin in an organic solvent for imparting coating evenness to the composition. The finely divided silica used herein includes a variety of silicas. Preferred is a finely divided silica resulting from burning reaction of $SiCl_4$ or $Si(OR^4)_4$ wherein $R^4$ is a $C_{1-10}$ alkyl group with oxygen. This silica can be silylated into a silica having a surface modified with an organic silyl group as represented by the formula:

wherein $R^5$, $R^6$, $R^7$, l and m are defined later, which is also preferred herein.

Finely divided silicas resulting from burning reaction of a silicon compound represented by $SiCl_4$ or $Si(OR^4)_4$ with oxygen are commercially available, for example, under the trade name of Aerogel (Nihon Aerogel K.K.). Silylation of these finely divided silicas may be effected by any well-known methods using chlorosilanes, alkoxysilanes and silazanes having lower alkyl, epoxy, amino, methacryl, vinyl, phenyl, and mercapto groups. Examples of these silylating reagent are shown below.

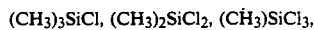

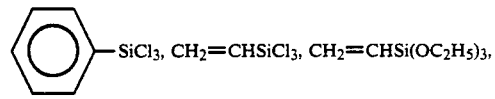

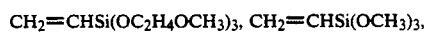

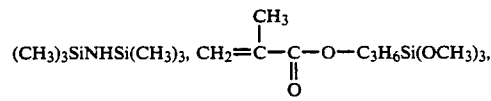

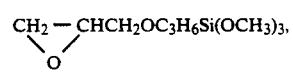

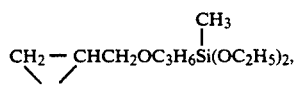

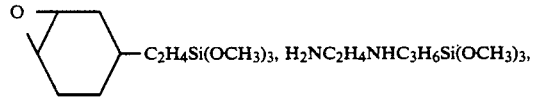

In formula (5), l and m represent the degree of silylation, and m/l is preferably less than 30, more preferably less than 20. When non-silylated silica or silica with a m/l of 30 or more is used in a composition, there is some likelihood that silica powder agglomerate during long-term shelf storage, resulting in the composition losing re-dispersibility and coating ability.

In formula (5), $R^5$, $R^6$ and $R^7$, which may by the same or different, are independently selected from monovalent organic groups having 1 to 10 carbon atoms, for example,

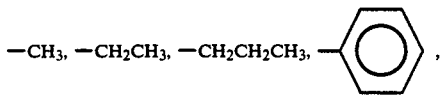

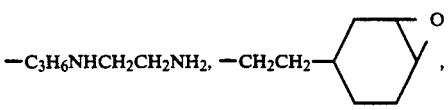

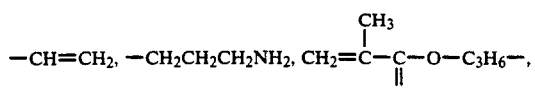

-continued

—CH₂CH₂CH₂SH, and —C₃H₆OCH₂CH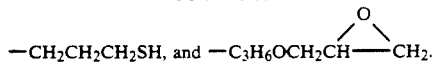CH₂.

The finely divided silica may have any desired particle size and specific surface area although a particle size of up to 10 μm and a specific surface area of from 100 to 500 m²/gram as measured by the BET method are preferred.

The semiconductor element protecting composition of the invention contains a polyimide resin and a finely divided silica, both as defined above, in any desired proportions suitable for working and the like. Often, the polyimide resin is present in an amount of 2 to 50% by weight, preferably 5 to 30% by weight of the composition and the finely divided silica is present in an amount of 2 to 30% by weight, preferably 5 to 20% by weight of the polyimide resin.

With the use of protective polyimide resin composition of the invention, uniform, defect-free polyimide resin coatings having improved adherence to elements and wiring, heat resistance, electrical and mechanical properties are readily obtained through a low-temperature, short-term heat treatment. Protective coatings can be formed on semiconductor elements from the protective polyimide resin composition, for example, simply by applying the composition to the elements by spin coating, dispenser dripping, or other well-known coating methods, and heating the coatings at a temperature of about 120° C. to 180° C. for about one to about three hours, thereby causing the organic solvent to volatilize.

As described above, the semiconductor element protecting composition of the invention can utilize a low-boiling solvent, typically a low-boiling, highly-volatile ether or ketone solvent and a mixture thereof, and remains stable in solution form for a long time. Even pinhole-free polyimide resin coatings having improved adherence, heat resistance, electrical and mechanical properties are readily obtained by applying the composition to semiconductor elements and subjecting the coatings to a low-temperature, short-term heat treatment. As compared with the prior art methods for the manufacture of polyimide resin coatings requiring a high-temperature, long-term heat treatment, the invention achieves a substantial energy saving and is of great commercial value. Therefore, semiconductor elements protected with cured coatings of the composition of the invention remain highly reliable.

EXAMPLE

Examples of the invention are given below by way of illustration and not by way of limitation.

EXAMPLE 1

A flask equipped with a stirrer, thermometer, and nitrogen inlet tube was charged with 4.4 grams (0.01 mol) of 2,2-bis(3,4-benzenedicarboxylic anhydride)perfluoropropane and 26.5 grams (0.09 mol) of 3,3',4,4'-biphenyltetracarboxylic dianhydride as a tetracarboxylic dianhydride component and 400 grams of N-methyl-2-pyrrolidone as a solvent. To the flask was added dropwise an N-methyl-2-pyrrolidone solution containing 19.8 grams (0.08 mol) of bis(3-aminopropyl)tetramethyldisiloxane and 8.2 grams (0.02 mol) of 2,2-bis[4-(4-aminophenoxy)phenyl]propane as a diamine component while the temperature of the reaction system was controlled so as not to exceed 50° C. After dropwise addition, the reaction mixture was stirred for a further ten hours at room temperature. Then the flask was equipped with a reflux condenser connected to a water collecting container and 30 grams of xylene was added to the flask. The reaction system was heated to 160° C. and maintained at the temperature for four hours to effect reaction. There was obtained a polyimide resin solution which was yellowish brown and clear. During the reaction, 3.4 grams of water formed as a by-product. The polyimide resin solution was poured into methanol from which the polyimide resin was precipitated again and isolated. Vacuum drying at 60° C. for 24 hours yielded 52.6 grams of a polyimide resin.

In an infrared absorption spectrum of this polyimide resin, no absorption attributable to polyamic acid was observed, but absorption peaks attributable to an imide group were observed at 1780 cm⁻¹ and 1720 cm⁻¹.

A semiconductor element protective composition was obtained by dissolving 10 grams of the polyimide resin in 90 grams of cyclohexanone, blending 1 gram of finely divided silica surface modified with a trimethylsilyl group having a specific surface area of 130 m²/g, and milling in a three-roll mill.

EXAMPLE 2

The procedure of Example 1 was repeated except that 13.3 grams (0.03 mol) of 2,2-bis(3,4-benzenedicarboxylic anhydride)perfluoropropane and 20.6 grams (0.07 mol) of 3,3',4,4'-biphenyltetracarboxylic dianhydride were used as the tetracarboxylic dianhydride component and 2.6 grams (0.01 mol) of 1,2-bis(γ-aminopropyldimethylsilyl)ethane and 36.9 grams (0.09 mol) of 2,2-bis[4-(4-aminophenoxy)phenyl]propane were used as the diamine component. There was obtained 67.1 grams of a polyimide resin.

A semiconductor element protective composition was obtained by dissolving 10 grams of the polyimide resin in 45 grams of cyclohexanone and 45 grams of THF, blending 1 gram of finely divided silica surface modified with a trimethylsilyl group having a specific surface area of 180 m²/g, and milling in a three-roll mill.

EXAMPLE 3

A flask equipped with a stirrer, thermometer, and nitrogen inlet tube was charged with 4.4 grams (0.01 mol) of 2,2-bis(3,4-benzenedicarboxylic anhydride)perfluoropropane and 26.5 grams (0.09 mol) of 3,3',4,4'-biphenyltetracarboxylic dianhydride as a tetracarboxylic dianhydride component and 400 grams of N-methyl-2-pyrrolidone as a solvent. To the flask was added dropwise 69 grams of an N-methyl-2-pyrrolidone solution containing 20.8 grams (0.08 mol) of 1,2-bis(γ-aminopropyldimethylsilyl)ethane and 8.2 grams (0.02 mol) of 2,2-bis[4-(4-aminophenoxy)phenyl]propane as a diamine component while the temperature of the reaction system was controlled so as not to exceed 50° C. After dropwise addition, the reaction mixture was stirred for a further ten hours at room temperature. Then the flask was equipped with a reflux condenser connected to a water collecting container and 30 grams of xylene was added to the flask. The reaction system was heated to 160° C. and maintained at the temperature for four hours to effect reaction. There was obtained a polyimide resin solution which was yellowish brown and clear. During the reaction, 3.4 grams of water formed as a by-product. The polyimide resin solution was poured into methanol from which the polyimide resin was precipitated again and isolated. Vacuum drying at 60° C. for 24 hours yielded 52.8 grams of a polyimide resin.

In an infrared absorption spectrum of this polyimide resin, no absorption attributable to polyamic acid was observed, but absorption peaks attributable to an imide group were observed at 1780 cm$^{-1}$ and 1720 cm$^{-1}$.

This polyimide resin was soluble in tetrahydrofuran, 1,4-dioxane, cyclohexanone, and acetophenone.

Finely divided silica as used in Example 1 was added to a 10 wt % cyclohexanone solution of the polyimide resin.

EXAMPLE 4

The procedure of Example 1 was repeated except that 13.3 grams (0.03 mol) of 2,2-bis(3,4-benzenedicarboxylic anhydride)perfluoropropane and 20.6 grams (0.07 mol) of 3,3',4,4'-biphenyltetracarboxylic dianhydride were used as the tetracarboxylic dianhydride component and 15.6 grams (0.06 mol) of 1,2-bis(γ-aminopropyldimethylsilyl)ethane and 11.7 grams (0.04 mol) of 1,4-bis(4-aminophenoxy)benzene were used as the diamine component. There was obtained 54.1 grams of a polyimide resin.

This polyimide resin was soluble in tetrahydrofuran, 1,4-dioxane, cyclohexanone, and acetophenone.

Finely divided silica as used in Example 2 was added to a 10 wt % cyclohexanone solution of the polyimide resin.

EXAMPLE 5

The procedure of Example 1 was repeated except that 13.3 grams (0.03 mol) of 2,2-bis(3,4-benzenedicarboxylic anhydride)perfluoropropane and 22.6 grams (0.07 mol) of 3,3',4,4'-benzophenonetetracarboxylic dianhydride were used as the tetracarboxylic dianhydride component and 2.6 grams (0.01 mol) of 1,2-bis(γ-aminopropyldimethylsilyl)ethane and 36.9 grams (0.09 mol) of 2,2-bis[4-(4-aminophenoxy)phenyl]propane were used as the diamine component. There was obtained 68.9 grams of a polyimide resin.

This polyimide resin was soluble in tetrahydrofuran, 1,4-dioxane, cyclohexanone, and acetophenone.

Finely divided silica as used in Example 1 was added to a solution of 10% by weight of the polyimide resin in tetrahydrofuran and cyclohexanone (1:1).

EXAMPLE 6

The procedure of Example 1 was repeated except that 13.3 grams (0.03 mol) of 2,2-bis(3,4-benzenedicarboxylic anhydride)perfluoropropane and 22.6 grams (0.07 mol) of 3,3',4,4'-benzophenonetetracarboxylic dianhydride were used as the tetracarboxylic dianhydride component and 24.7 grams (0.08 mol) of 1,4-bis(γ-aminopropyldimethylsilyl)benzene and 10.4 grams (0.02 mol) of 2,2-bis[4-(4-aminophenoxy)phenyl]perfluoropropane were used as the diamine component. There was obtained 63.8 grams of a polyimide resin.

The polyimide resin was soluble in tetrahydrofuran, 1,4-dioxane, cyclohexanone, and acetophenone.

Finely divided silica as used in Example 2 was added to a 10 wt % 1,4-dioxane solution of the polyimide resin.

EXAMPLE 7

The procedure of Example 1 was repeated except that 22.2 grams (0.05 mol) of 2,2-bis(3,4-benzenedicarboxylic anhydride)perfluoropropane and 21.3 grams (0.05 mol) of 1,3-bis(3,4-dicarboxyphenyl)-1,1,3,3-tetramethyldisiloxane dianhydride were used as the tetracarboxylic dianhydride component and 9.3 grams (0.03 mol) of 1,4-bis(γ-aminopropyldimethylsilyl)benzene and 30.3 grams (0.07 mol) of bis[4-(4-aminophenoxy)phenyl]sulfone were used as the diamine component. There was obtained 75.4 grams of a polyimide resin.

The polyimide resin was soluble in tetrahydrofuran, 1,4-dioxane, cyclohexanone, and acetophenone.

Finely divided silica as used in Example 1 was added to a 10 wt % acetophenone solution of the polyimide resin.

EXAMPLE 8

The procedure of Example 1 was repeated except that 4.4 grams (0.01 mol) of 2,2-bis(3,4-benzenedicarboxylic anhydride)perfluoropropane and 26.5 grams (0.09 mol) of 3,3',4,4'-biphenyltetracarboxylic dianhydride were used as the tetracarboxylic dianhydride component and 24.8 grams (0.1 mol) of bis(3-aminopropyl)tetramethyldisiloxane was used as the diamine component. There was obtained 50.1 grams of a polyimide resin.

In an infrared absorption spectrum of this polyimide resin, no absorption attributable to polyamic acid was observed, but absorption peaks attributable to an imide group were observed at 1780 cm$^{-1}$ and 1720 cm$^{-1}$.

The polyimide resin was soluble in organic ether and ketone solvents including tetrahydrofuran, 1,4-dioxane, cyclohexanone, and acetophenone.

Finely divided silica as used in Example 2 was added to a 10 wt % tetrahydrofuran solution of the polyimide resin.

EXAMPLE 9

The procedure of Example 1 was repeated except that 4.4 grams (0.01 mol) of 2,2-bis(3,4-benzenedicarboxylic anhydride)perfluoropropane and 26.5 grams (0.09 mol) of 3,3',4,4'-biphenyltetracarboxylic dianhydride were used as the tetracarboxylic dianhydride component and 14.9 grams (0.06 mol) of bis(3-aminopropyl)tetramethyldisiloxane and 11.7 grams (0.04 mol) of 1,4-bis(4-aminophenoxy)benzene were used as the diamine component. There was obtained 50.8 grams of a polyimide resin.

Finely divided silica as used in Example 1 was added to a 10 wt % 1,4 dioxane solution of the polyimide resin.

EXAMPLE 10

The procedure of Example 1 was repeated except that 22.2 grams (0.05 mol) of 2,2-bis(3,4-benzenedicarboxylic anhydride)perfluoropropane and 16.1 grams (0.05 mol) of 3,3',4,4'-benzophenonetetracarboxylic dianhydride were used as the tetracarboxylic dianhydride component and 14.9 grams (0.06 mol) of bis(3-aminopropyl)tetramethyldisiloxane and 16.4 grams (0.04 mol) of 2,2-bis[4-(4-aminophenoxy)phenyl]propane were used as the diamine component. There was obtained 62.3 grams of a polyimide resin.

Finely divided silica as used in Example 1 was added to a 10 wt % cyclohexanone solution of the polyimide resin.

EXAMPLE 11

The procedure of Example 1 was repeated except that 22.2 grams (0.05 mol) of 2,2-bis(3,4-benzenedicarboxylic anhydride)perfluoropropane and 21.3 grams (0.05 mol) of 1,3-bis(3,4-dicarboxyphenyl)-1,1,3,3-tetramethyldisiloxane dianhydride were used as the tetracarboxylic dianhydride component and 7.5 grams (0.03 mol) of bis(3-aminopropyl)tetramethyldisiloxane and 30.3 grams (0.07 mol) of bis[4-(4-aminophenoxy)-phenyl]sulfone were used as the diamine component. There was obtained 78.1 grams of a polyimide resin.

Finely divided silica as used in Example 2 was added to a 10 wt % cyclohexanone solution of the polyimide resin.

COMPARATIVE EXAMPLE

A composition was obtained by dissolving 10 grams of the polyimide resin in 90 grams of cyclohexanone.

The compositions of Examples 1 and 2 and Comparative Example were applied to transistors and heated for one hour at 180° C. The resin coatings formed on the elements after heat treatment were observed for appearance, finding that the coatings of Examples 1 and 2 were uniform and fully acceptable, but the coating of Comparative Example was non-uniform near the periphery of the element.

The elements protected with the three types of coatings were encapsulated with an epoxy resin and subjected to a bias test at a high temperature (150° C.) with the following results.

|  | Rejected (%) |
| --- | --- |
| Example 1 | 0 |
| Example 2 | 0 |
| Comparative Example | 40 |

As is evident from these results, the semiconductor element protecting composition of the invention can be converted into protective coatings having sufficient properties for semiconductor protection through a low-temperature brief heat treatment after being applied to semiconductor elements.

Several preferred embodiments have been described. Obviously many modifications and variations of the present invention are possible in the light of the above teachings. It is therefore to be understood that within the scope of the appended claims, the invention may be practiced otherwise than as specifically described.

We claim:
1. A semiconductor element protecting composition comprising a polyimide resin, a solvent therefor, and finely divided silica, wherein said polyimide resin is prepared by polymerizing

(A) a tetracarboxylic acid dianhydride component consisting essentially of 10 to 50 mol % of the acid dianhydride of the structural formula:

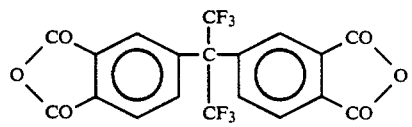

and 90 to 50 mol % of an acid dianhydride of the structural formula:

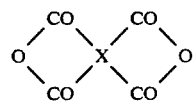

wherein X is a tetravalent organic group selected from the class consisting of

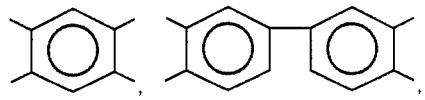

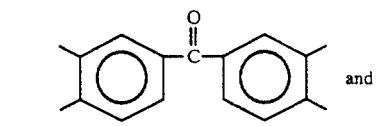

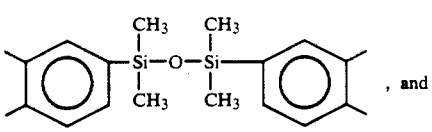

(B) a diamine component consisting essentially of 10 to 80 mol % of a silicon diamine of the structural formula:

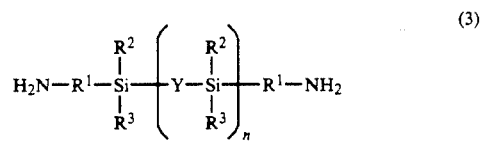

wherein $R^1$ is a divalent organic group having 1 to 18 carbon atoms, $R^2$ and $R^3$ are independently selected from substituted or unsubstituted monovalent hydrocarbon groups having 1 to 10 carbon atoms, Y is an oxygen atom or a divalent hydrocarbon group having 1 to 10 carbon atoms, and letter n is an integer of from 1 to 100, and 90 to 20 mol % of an ether diamine of the formula:

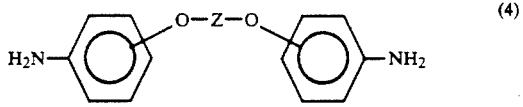

wherein Z is a divalent organic group having 6 to 18 carbon atoms containing an aromatic ring, with the proviso that diamine component (B) consists essentially of 5 to 100 mol % of the silicon diamine and (3) and 95 to 0 mol % of the ether diamine of formula (4) when Y in formula (3) is an oxygen atom.

2. The composition of claim 1 wherein Z in formula (4) is selected from the class consisting of

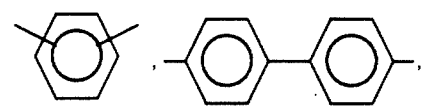

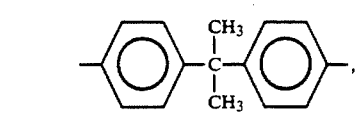

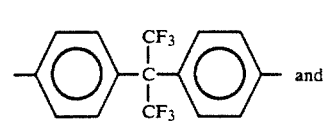

-continued

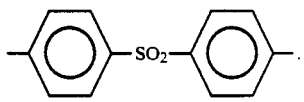

3. The composition of claim 1 wherein the tetracarboxylic dianhydride component (A) and the diamine component (B) are blended in a molar ratio of from 0.9 to 1.1

4. The composition of claim 1 wherein the solvent is selected from the class consisting of ethers, ketones, and mixtures thereof.

5. The composition of claim 4 wherein said finely divided silica is one resulting from burning reaction of $SiCl_4$ or $Si(OR^4)_4$ wherein $R^4$ is a $C_{1-10}$ alkyl group with oxygen.

6. The composition of claim 4 wherein said finely divided silica is a silica having a surface modified with an organic silyl group.

7. The composition of claim 4 wherein said polyimide resin is present in an amount of 2 to 50% by weight of the composition and said finely divided silica is present in an amount of 2 to 30% by weight of said polyimide resin.

8. A protective coating for semiconductor elements obtained from the composition of any one of claims 1 to 7.

9. The composition of claim 1 wherein said component (A) consists essentially of 20 to 50 mol % of the acid dianhydride of formula (1) and 80 to 50 mole % of the acid dianhydride of formula (2).

10. The composition of claim 1 wherein said component (B) consists essentially of 20 to 60 mol % of the silicon diamine of formula (3) and 80 to 40 mol % of the ether diamine of formula (4) when Y in formula (3) is a divalent hydrocarbon group.

11. The composition of claim 1 wherein said component (B) consists essentially of 20 to 60 mol % of the silicon diamine of formula (3) and 80 to 20 mol % of the ether diamine of formula (4) when Y in formula (3) is an oxygen atom.

12. The composition of claim 1 wherein the tetracarboxylic dianhydride component (A) and the diamine component (B) are blended in a molar ratio of from 0.95 to 1.05.

13. The composition of claim 6 wherein said silica is modified with an organic silyl group represented by the formula $(R^5R^6R^7SiO_{\frac{1}{2}})_l(SiO_2)_m$, wherein $l$ and $m$ represent the degree of silylation and $m/l$ is less than 30, and wherein $R^5$, $R^6$ and $R^7$ are the same or different and are independently selected from monovalent organic groups having 1 to 10 carbon atoms.

14. The composition of claim 1 wherein the finely divided silica has a particle size of up to 10 microns and a specific surface area of from 100 to 500 $m^2$/gram as measured by the BET method.

15. The composition of claim 1 wherein said polyimide resin is present in an amount of 5 to 30% by weight of the composition and said finely divided silica is present in an amount of 5 to 20% by weight of said polyimide resin.

* * * * *